(12) United States Patent
Chan et al.

(10) Patent No.: US 8,248,127 B2
(45) Date of Patent: Aug. 21, 2012

(54) DIGITAL PHASE LOCK SYSTEM WITH DITHERING PULSE-WIDTH-MODULATION CONTROLLER

(75) Inventors: Chi Fat Chan, Hong Kong (HK); Chien-Wei Lin, Hong Kong (HK); Gordon Chung, Hong Kong (HK)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 93 days.

(21) Appl. No.: 12/851,209

(22) Filed: Aug. 5, 2010

(65) Prior Publication Data
US 2012/0032718 A1 Feb. 9, 2012

(51) Int. Cl.
*H03K 3/017* (2006.01)
*H03K 5/04* (2006.01)
*H03K 7/08* (2006.01)

(52) U.S. Cl. ........ 327/172; 327/156; 327/158; 327/161; 331/16; 375/361

(58) Field of Classification Search .......... 327/156, 327/158, 161, 172; 331/16; 375/361
See application file for complete search history.

(56) References Cited

U.S. PATENT DOCUMENTS

| | | | |
|---|---|---|---|
| 7,385,539 B2 | 6/2008 | Vanselow et al. | |
| 2005/0206458 A1 | 9/2005 | Wu | |
| 2010/0315140 A1 * | 12/2010 | Mayer et al. | 327/159 |

OTHER PUBLICATIONS

Fahim, A.M., et al, "A Compact, Low-Power Low-Jitter Digital PLL", IEEE ESSCIRC 2003.
Chao, T.C., et al, "A 1.7mW all digital phase-locked loop with new gain generator and low power DCO", IEEE ISCAS 2006.
Vamvakos, S.D., et al, "Noise Analysis of Time-to-Digital Converter in All-Digital PLLs", IEEE DCAS 2006.
Syllaios, I.L., et al, "Time-Domain Modeling of an RF All-Digital PLL", IEEE TCAS II 2008.
Hsu, C-M, et al, "A Low-Noise Wide-BW 3.6-GHz Digital DSM Fractional-N Frequency Synthesizer With Noise-Shaping Time-To-Digital Converter and Quantization Noise Cancellation", IEEE JSSC 2008.
Staszewski et al, "A Digitally Controlled Oscillator in a 90 nm Digital CMOS Process for Mobile Phones" IEEE JSSC vol. 40 No. 11, pp. 2203-2211, Nov. 2005.

* cited by examiner

*Primary Examiner* — John Poos
(74) *Attorney, Agent, or Firm* — Stuart T. Auvinen; gPatent LLC

(57) ABSTRACT

A Digital Phase-Locked Loop (DPLL) has a digitally-controlled oscillator (DCO) that generates an output clock frequency determined by a digital input with most-significant-bits (MSB's) and a least-significant-bit (LSB). The LSB is generated by a Pulse-Width-Modulation (PWM) controller clocked by a control clock that is the output clock divided by C. A reference clock is compared to a feedback clock that is the output clock divided by M. The PWM controller generates M/C LSB's for each reference clock period and loads them in parallel to a parallel-to-serial shift register that serially delivers the LSBs. The pulse width is determined by a fine digital loop filter that filters phase comparison results using a fine time resolution. A coarse digital loop filter generates the MSB's from phase comparison results using a coarse time resolution. LSB waveforms are dithered by randomly selecting high-going or low-going pulses and randomly adjusting pulse widths.

18 Claims, 13 Drawing Sheets

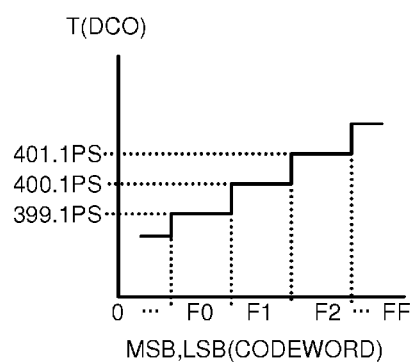
FIG. 4
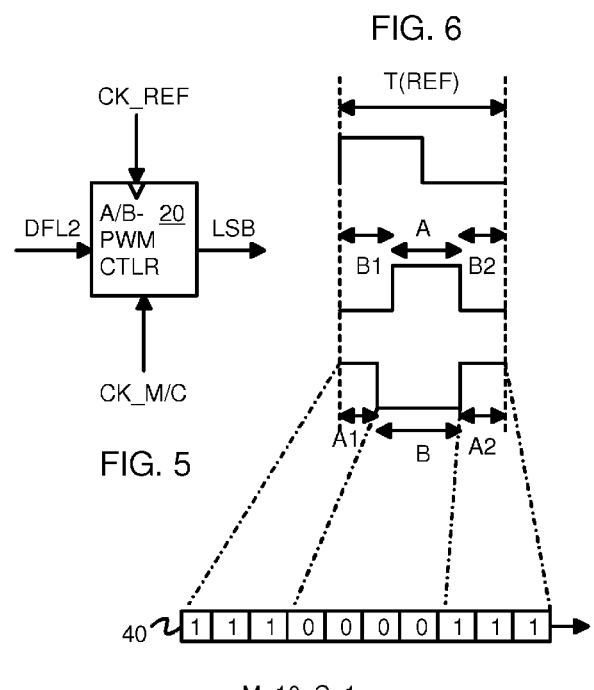
FIG. 5
FIG. 6
M=10, C=1

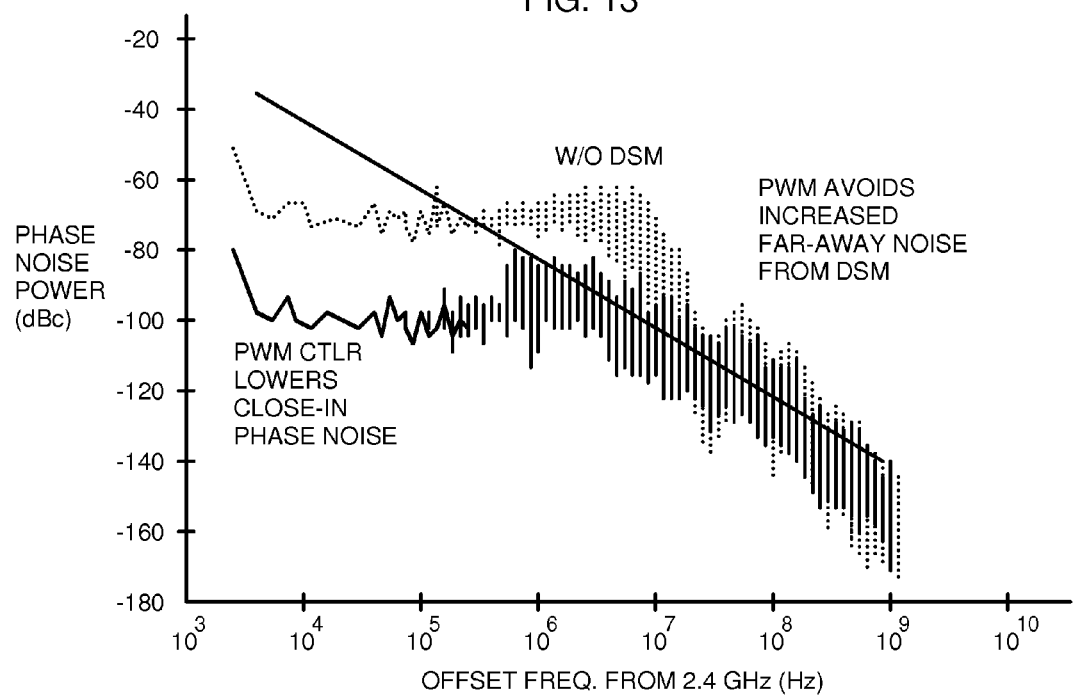

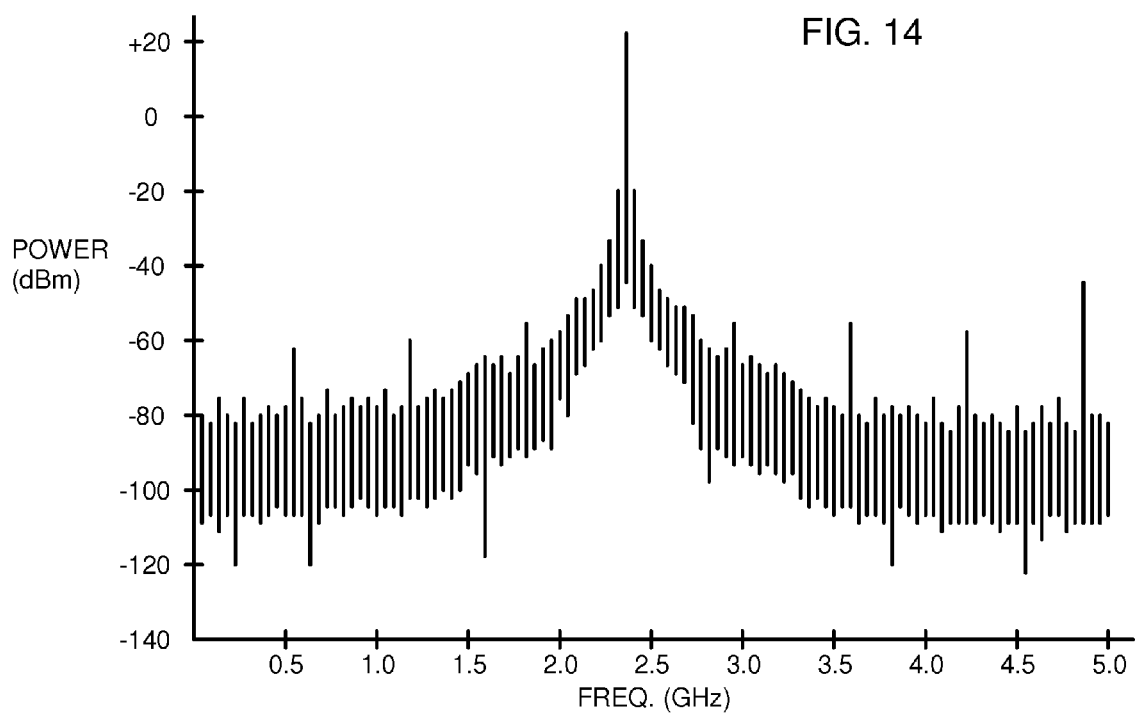

DIGITAL PHASE LOCK SYSTEM WITH DITHERING PULSE-WIDTH-MODULATION CONTROLLER

FIELD OF THE INVENTION

This invention relates to digital Phase-locked loops (PLL's), and more particularly to digital phase-locking systems using pulse-width modulation (PWM) control.

BACKGROUND OF THE INVENTION

Phase-locked loops (PLL's) are widely used for generating clocks for a variety of systems. More recently, analog PLL's have been replaced by digital PLLs. Digital controls in such digital PLLs' may be less susceptible to noise while consuming less power.

However, digital phase-lock systems have a quantization error that results in a finite phase error. This quantization error is not preset in analog systems. The finite phase error produced by the digital oscillator appears on the output clock. However, this finite phase error is amplified by the feedback divider and applied to the phase comparator. The loose phase tracking with the input clock ultimately results in increased jitter in the form of a large close-in phase noise.

FIG. 1 is a graph of estimated phase noise in a prior-art digital phase-lock system. Phase noise is plotted as a function of offset frequency from the center frequency of the oscillator, such as 2.4 GHz. FIG. 1 shows that the phase noise is high at low offset frequencies. However, this phase noise is much lower for large frequency offsets.

One solution to the close-in phase noise problem is to use a delta-sigma modulator (DSM) to control the least-significant-bit (LSB) of the digital value applied as the input to the digital-controlled oscillator (DCO). The DSM improvers the tuning of the feedback clock to improve the quantization error and reduce the finite phase error. The lower finite phase error that is amplified by the feedback divider results in a more accurate phase tracking in the front end, and thus reduces close-in phase noise.

FIG. 2 is a graph of estimated phase noise in a prior-art digital phase-lock system using a delta-sigma modulator (DSM). The DSM (solid line) produces a lower close-in phase error than the standard digital phase system graphed in FIG. 1 (dotted line), reducing the phase error by about 30 dB in this example.

However, the DSM produces a larger far-away phase error, as can be seen at the higher frequencies in FIG. 2. Phase noise is transferred from close-in to far-away by the DSM. Jitter may be too high when higher frequencies are used. The closer the DSM is operated to the frequency of the output clock, the greater the shift of phase noise from close-in to far-away frequency regions.

Another problem with the DSM is that the DSM is operated at a high frequency, and has high power consumption at these high frequencies. The high speed logic can put a stress on the logic systems when the DSM is integrated with logic systems, such as on a System-On-a-Chip (SOC).

What is desired is a digital phase-lock system that has improved phase tracking without transferring phase noise from close-in to far-away frequency regions. A control circuit to replace the delta-sigma modulator (DSM) is desired. A control circuit that has few circuits operating at a high frequency is desirable to reduce power consumption and circuit complexity. A control circuit that uses dithering to reduce spur noise is also desirable.

BRIEF DESCRIPTION OF THE DRAWINGS

FIG. 4 is a graph highlighting operation of the digitally-controlled oscillator (DCO).

FIG. 5 highlights the PWM controller.

FIG. 6 highlights pulse generation by PWM controller 20 using a parallel-to-serial shift register.

FIG. 13 is a phase-noise plot comparing the PWM digital phase-lock system to a delta-sigma modulator (DSM) system.

FIG. 14 is a graph of the power spectrum of the clock output by the digitally-controlled oscillator.

DETAILED DESCRIPTION

The present invention relates to an improvement in digital phase-lock systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have discovered that a Pulse-Width-Modulation (PWM) control circuit can replace a delta-sigma modulator (DSM) and still reduce close-in phase noise. Far-away phase noise is not significantly increased with the PWM control as was the case with the DSM. Many parts of the PWM control circuit can operate at a reduced clock rate, reducing power consumption. Dithered pulses rise or fall timing can be employed to reduce spur power and noise spikes due to harmonics.

Figure 3:
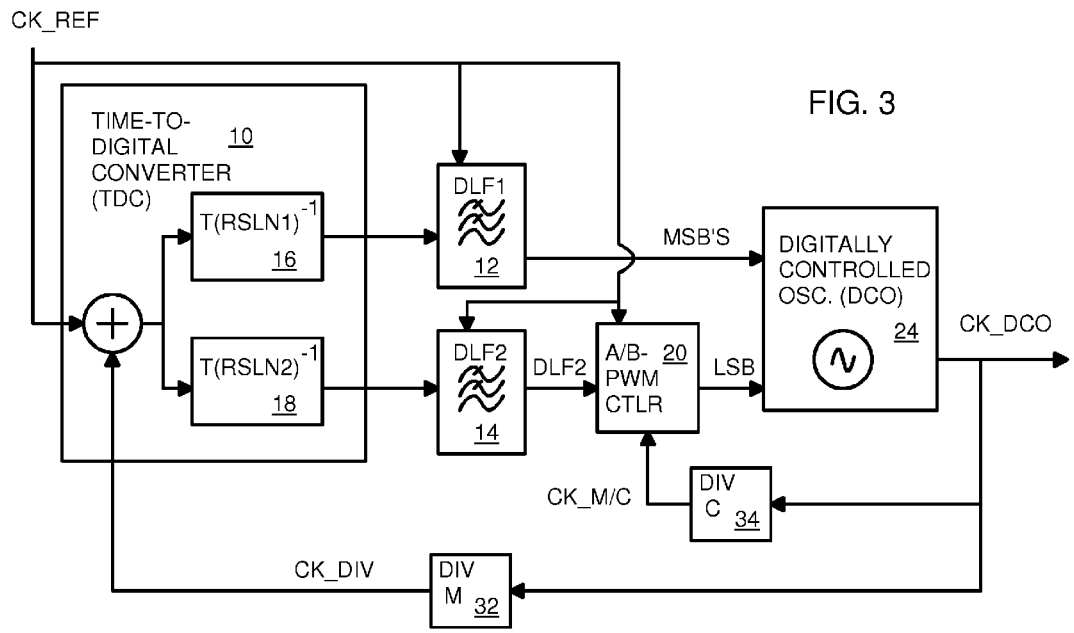
FIG. 3 is a diagram of a digital Phase-locked loop (PLL) with Pulse-Width-Modulation (PWM) control.

FIG. 3 is a diagram of a digital Phase-locked loop (PLL) with Pulse-Width-Modulation (PWM) control. An output clock CK_DCO is produced by digitally-controlled oscillator (DCO) 24. The frequency of CK_DCO depends on the input value applied to DCO 24. The input value to DCO 24 is a digital word with MSB's and an LSB.

The output clock CK_DCO is fed back through feedback divider 32 to generate divided clock CK_DIV, which has a frequency that is 1/M of the output frequency of CK_DCO, where M is a whole number (1, 2, 3, ...). In some systems, M is often a large number, such as 100 or more.

Time-to-Digital Converter (TDC) 10 has a phase comparator that compares the phase of an input reference clock CK_REF to the phase of feedback divided clock CK_DIV.

TDC 10 operates with two different time resolutions. A phase comparison using a coarse resolution 1/Trs1n1 is performed by coarse resolver 16 in TDC 10, producing a signal that is filtered by coarse digital loop filter 12 to generate the most-significant-bits (MSBs) that are input to DCO 24.

A phase comparison using a fine resolution 1/Trs1n2 is performed by fine resolver 18 in TDC 10, producing a signal that is filtered by fine digital loop filter 14 to generate filtered signal DLF2.

Pulse-Width-Modulation (PWM) controller 20 generates the least-significant-bit (LSB) that is input to DCO 24. The DLF2 value from fine digital loop filter 14 determines the pulse width of the LSB generated by PWM controller 20. More precisely, DLF2 determines the duty cycle, or percent of the clock period that the pulse is high, rather than the absolute time that the pulse is high. The length of the LSB period is determined by control divider 34, which divides output clock CK_DCO by C, where C is a whole number. The control clock CK_M/C generated by control divider 34 has a frequency that is M/C times the frequency of reference clock CK_REF at steady state.

PWM controller 20 generates M/C pulses of the LSB clock for each pulse of reference clock CK_REF. For example, when M=10 and C=2, control clock CK_M/C is 5 times faster than CK_REF, and PWM controller 20 generates 5 LSB pulses during one period of CK_REF.

Feedback clock CK_DIV and reference clock CK_REF lock to each other and have the same frequency. Output clock CK_DCO is M times faster than CK_DIV due to feedback divider 32. Control clock CK_M/C is C times slower than output clock CK_DCO due to control divider 34. Thus control clock CK_M/C is running M times faster and C times slower than CK_REF.

Reference clock CK_REF is applied to PWM controller 20, coarse digital loop filter 12, and fine digital loop filter 14, and clocks digital values and signals between these blocks. Coarse digital loop filter 12 and fine digital loop filter 14 can perform integrations, reducing the phase error to +/−1/trs1n2.

FIG. 4 is a graph highlighting operation of the digitally-controlled oscillator (DCO). An input value to DCO 24 (FIG. 3) is a codeword or digital value with many MSB's and 1 or more LSB's. For example, and 8-bit digital value can range from 00 to FF Hex.

As the digital value increases, the frequency of oscillation decreases. For example, digital value F0 produces a period of output clock CK_DCO of 399.1 ps. Digital value F1 produces a period of output clock CK_DCO of 400.1 ps, while digital value F2 produces a period of output clock CK_DCO of 401.1 ps. The output clock period can be adjusted in steps of 1 ps.

FIG. 5 highlights the PWM controller. PWM controller 20 receives value DLF2 from fine digital loop filter 14, control clock CK_M/C from control divider 34, and reference clock CK_REF which clocks most of the logic in PWM controller 20. Since M is usually larger than C, such as M=10, C=1, CK_REF is a slower clock than the LSB and thus power consumption is reduced. The LSB generated by PWM controller 20 is generated by a serial output of a parallel-to-serial shift register that is clocked by the faster CK_M/C. Thus the serial register operates at a higher frequency and consumes power, allowing the remaining circuits in PWM controller 20 to operate at a lower frequency and reduce overall power consumption.

FIG. 6 highlights pulse generation by PWM controller 20 using a parallel-to-serial shift register. PWM controller 20 generates C pulses of the LSB for each period of CK_REF. In this example, C=1 and one pulse is generated for the CK_REF period.

The width of the pulse, A, is determined by value DLF2. The low width of the pulse is B1+B2. PWM controller 20 can also generate a low-going pulse with B low and A1+A2 high. M/C bits of parallel-to-serial shift register 40 are loaded for each period of CK_REF. A 1 is loaded for the M/C fraction of the period when the pulse is high, and a 0 is loaded for the M/C fraction of the period when the pulse is low.

In the example shown in FIG. 6, parallel-to-serial shift register 40 is loaded with three 1's for the A1 portion of the bottom waveform, then four 0's are loaded into the next four bits of parallel-to-serial shift register 40 for the B portion of the waveform. Finally the last three bits of parallel-to-serial shift register 40 are loaded with 1's for the A2 portion of the waveform. In practice, all 10 bits of parallel-to-serial shift register 40 may be loaded in parallel, at the same time. Then the bits in parallel-to-serial shift register 40 are shifted out serially by control clock CK_M/C, one bit at a time to the LSB input of digitally-controlled oscillator (DCO) 24.

Figure 7:
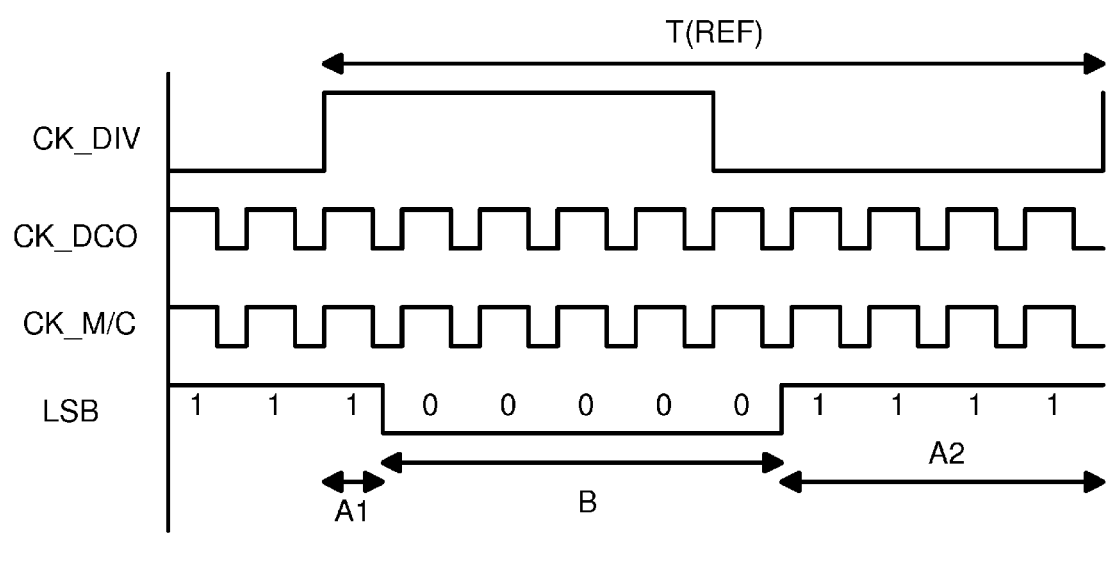
FIG. 7 is a waveform of LSB generation by the PWM controller for a simple example.

FIG. 7 is a waveform of LSB generation by the PWM controller for a simple example. In this example, M=10 and C=1. The values of M and C are chosen by the circuit designer or may be programmable and change upon initialization, but they do not change during normal operation. Feedback clock CK_DIV phase-locks to reference clock CK_REF and so has the same period T(REF).

The output clock CK_DCO that is generated by DCO 24 (FIG. 3) has 10 periods during T(REF) because feedback divider 32 divides CK_DCO by M=10 to generate CK_DIV. Control clock CK_M/C is C times slower than CK_DCO due to control divider 34, but since C=1, CK_M/C is about the same as CK_DCO.

PWM controller 20 loads 10 bits into parallel-to-serial shift register 40 (FIG. 6) for each T(REF) period. The values of A1, B, and A2 are determined by PWM controller 20 using value DLF2. In this example, A1 is one bit long, B is 5 bits long, and A2 is 4 bits long. This creates a low-going pulse for the LSB when these 10 bits are shifted out serially from parallel-to-serial shift register 40.

Figure 8:
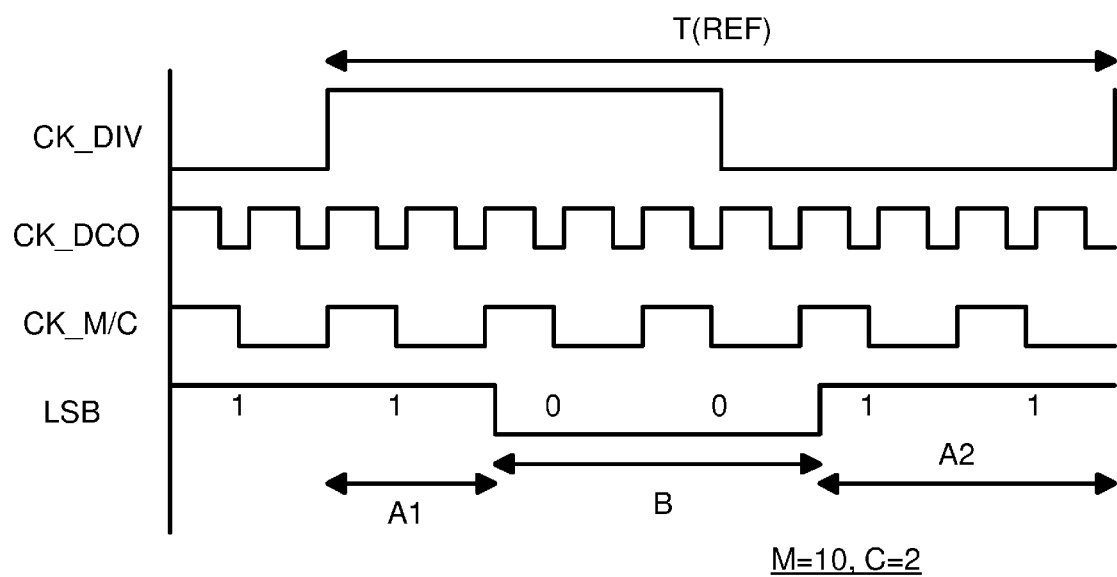
FIG. 8 is a waveform of LSB generation by the PWM controller for a more complex example.

FIG. 8 is a waveform of LSB generation by the PWM controller for a more complex example. In this example, M=10 and C=2.

The output clock CK_DCO generated by DCO 24 (FIG. 3) has 10 periods during T(REF) because feedback divider 32 divides CK_DCO by M=10 to generate CK_DIV. Control clock CK_M/C is C=2 times slower than CK_DCO due to control divider 34, which combines every two periods of CK_DCO into 1 period of CK_D/C.

PWM controller 20 loads only 5 bits into parallel-to-serial shift register 40 (FIG. 6) for each T(REF) period since M/C=10/2=5. The values of A1, B, and A2 are determined by PWM controller 20 using value DLF2. In this example, A1 is one bit long, B is two bits long, and A2 is two bits long. This creates a low-going pulse for the LSB when these 5 bits are shifted out serially from parallel-to-serial shift register 40.

The higher value of C in FIG. 8 allows the LSB to be clocked at a slower rate, reducing power, but phase tracking is not as accurate as for the example of FIG. 7.

Figure 9A:
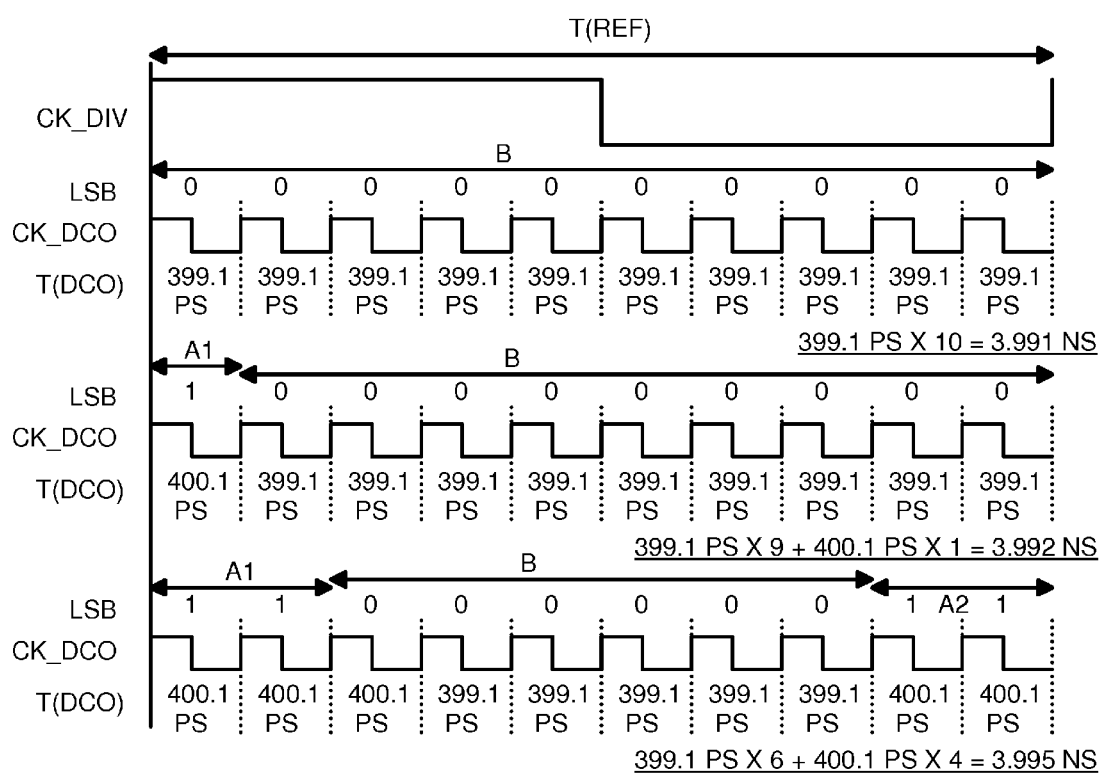
FIGS. 9A-B show how pulse-width modulation of the LSB also changes the frequency of the output clock from the digitally-controlled oscillator (DCO).
Figure 9B:
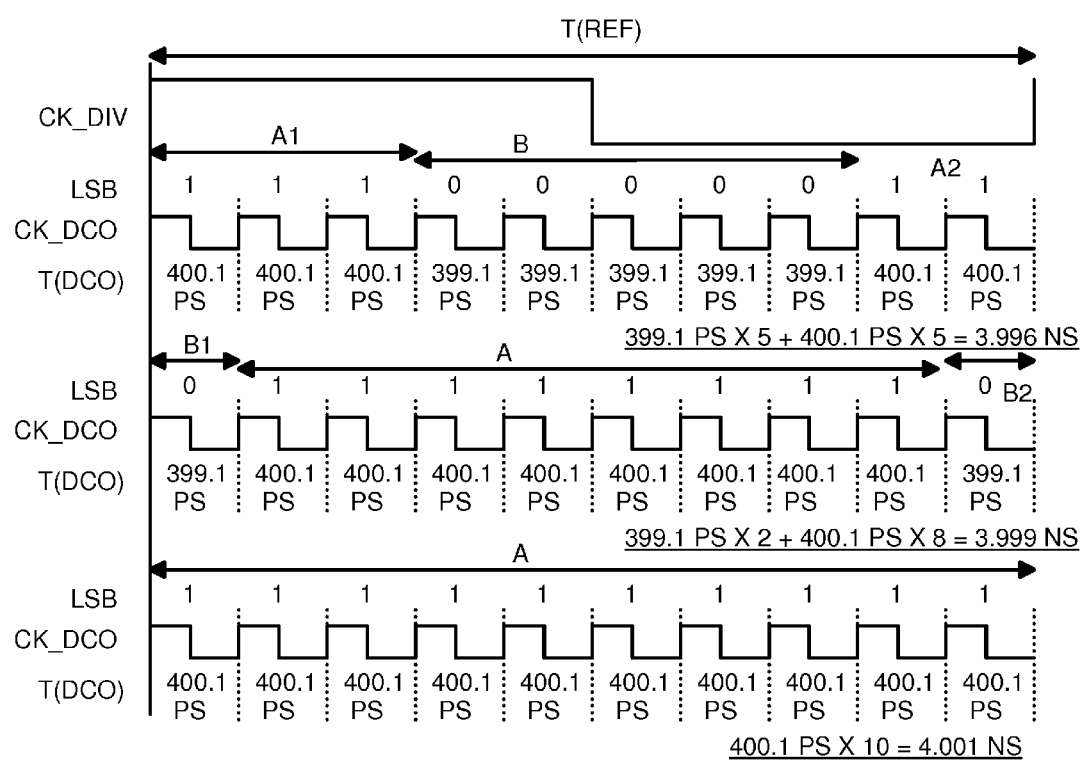

FIGS. 9A-B show how pulse-width modulation of the LSB also changes the frequency of the output clock from the digitally-controlled oscillator (DCO). In these examples, M=10 and C=1. The first pattern in FIG. 9A has all 0's for the LSB during the period T(REF) shown. For this value of the MSB's and LSB=0, the period generated by digitally-controlled oscillator (DCO) 24 is 399.1 ps, such as value F0 of FIG. 4. The period of CK_DIV generated by the 10 periods of T_DCO is 399.1 ps x10=3.991 ns.

The second LSB pattern in FIG. 9A has the first bit high for A1, and the remaining 9 bits low for the B portion of the generated waveform. When LSB=1, the period generated by digitally-controlled oscillator (DCO) 24 is 400.1 ps, such as value F1 of FIG. 4. The period of CK_DIV generated by the 10 periods of T_DCO is 400.1 ps ×1+399.1 ps×9=3.992 ns. Thus the pattern of A1=1, B=9 produces a period that is 0.001 ns larger than the pattern of B=10.

The third LSB pattern in FIG. 9A has the first two bits high for A1, and the last two bits high for A2, and the remaining 6 bits low for the B portion of the generated waveform. When LSB=1, the period generated by digitally-controlled oscillator (DCO) 24 is 400.1 ps, while LSB=0 produces 399.1 ps. The period of CK_DIV generated by the periods of T_DCO is 400.1 ps×4+399.1 ps×6=3.995 ns. Thus the pattern of A1=2, B=6, A 2=2 produces a period that is 0.004 ns larger than the pattern of B=10.

In FIG. 9B, the first LSB pattern has the first three bits high for A1, and the last two bits high for A2, and the remaining 5 bits low for the B portion of the generated waveform. When LSB=1, the period generated by digitally-controlled oscillator (DCO) 24 is 400.1 ps, while LSB=0 produces 399.1 ps. The period of CK_DIV generated by the periods of T_DCO is 400.1 ps×5+399.1 ps×5=3.996 ns. Thus the pattern of A1=3, B=5, A 2=2 produces a period that is 0.005 ns larger than the pattern of B=10.

The second LSB pattern in FIG. 9B has the first bit low for B1, and the last bit low for B2, and the remaining 8 bits high for the A portion of the generated waveform. The period of CK_DIV generated by the 10 periods of T_DCO is 400.1 ps×8+399.1 ps×2=3.999 ns. Thus the pattern of B1=1, A=8, B 2=1 produces a period that is 0.008 ns larger than the initial pattern of B=10.

The final LSB pattern in FIG. 9B has all ten bits high for the A portion of the generated waveform. The period of CK_DIV generated by the 10 periods of T_DCO is 400.1 ps ×10=4.001 ns. Thus the pattern of A=10 produces a period that is 0.010 ns larger than the initial pattern of B=10.

PWM controller 20 can dynamically select the waveform LSB pattern from among those shown in FIGS. 9A-B, and from among other possible waveforms, to dynamically adjust the output clock. For example, when the output clock is slightly too fast, phase comparison by TDC 10 causes DLF2 to rise, increasing the A pulse width. PWM controller 20 responds to the larger value of DLF2 by increasing the number of bits of A and decreasing the number of bits of B in the generated waveforms of the LSB. For example, when the third waveform of FIG. 9A (A1+A2=4) is being generated by PWM controller 20, but DLF2 increases, PWM controller 20 increases A, such as by generating the first waveform in FIG. 9B, with A1+A2=5. If DLF2 increases by a larger amount, PWM controller 20 may jump to a larger value of A, such as A=8 or A=10 in the last two waveforms in FIG. 9B. Still larger increases would cause the MSB's to change.

Figure 10:
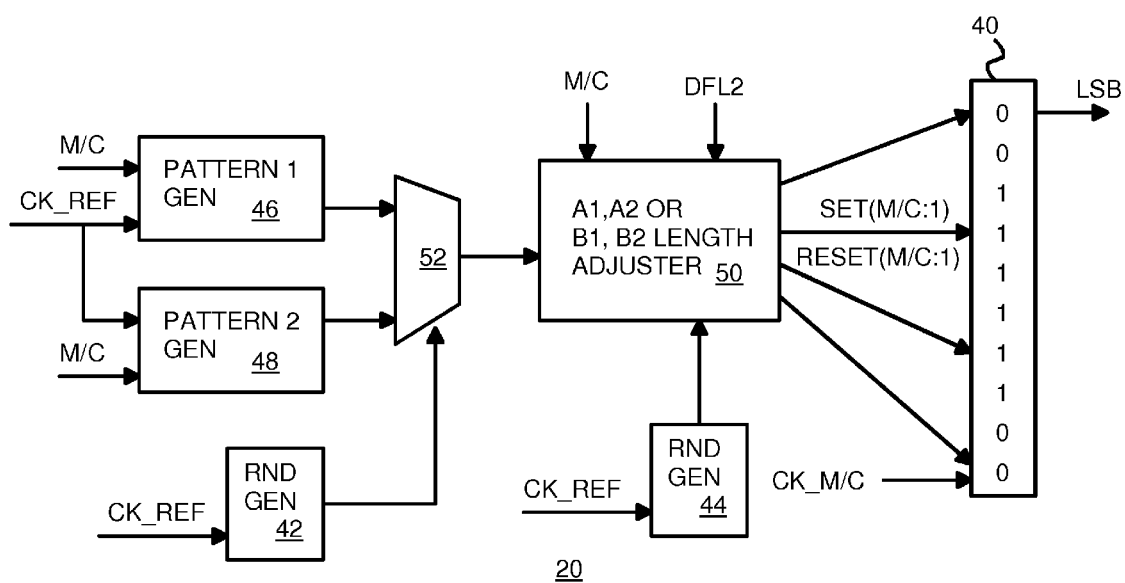
FIG. 10 shows a randomizing PWM controller.

FIG. 10 shows a randomizing PWM controller. If the same LSB pattern is repeated over many clock periods, harmonics many be created from the multiple identical patterns, or from modulations among the LSB patterns. Spur power from these harmonics may contribute to spikes in noise at certain frequencies. Such harmonic noise is undesirable.

PWM controller 20 can be modified to randomize the generation of LSB waveforms. Different waveform patterns with the same pulse width are randomly selected to dither the LSB waveforms. Such dithering reduces harmonic noise and spur power.

Pattern generator 46 generates a B1-A-B2 (A) pattern that has M/C LSB bits for each period of the reference clock CK_REF. Pattern generator 48 generates an A1-B-A2 (B) pattern that also has M/C LSB bits for each period of the reference clock CK_REF. Pattern generator 46 has a high-going pulse while pattern generator generates a low-going pulse since A represents the high portion and B represents the low portion of the control clock period.

Mux 52 selects either the A pattern from pattern generator 46 or the B pattern from pattern generator 48. Random generator 42 generates a new random number for each period of CK_REF. The random number from random generator 42 causes mux 52 to select either pattern A or pattern B. For example, random generator could randomly generate 1 or 0, with 1 causing mux 52 to select pattern A from pattern generator 46, and a 0 causing mux 52 to select pattern B from pattern generator 48.

The randomly-selected pattern from mux 52 is input to length adjuster 50, which also received value DLF2 from fine digital loop filter 14 (FIG. 3). Length adjuster 50 also receives M/C and loads M/C bits into parallel-to-serial shift register 40 for each period of CK_REF. These bits are serially shifted out of parallel-to-serial shift control clock CK_M/C as the LSB to digitally-controlled oscillator (DCO) 24.

The high pulse width, either A or A1+A2, is determined by length adjuster 50 using value DLF2 from fine digital loop filter 14. Random generator 44 generates a new random number for each reference clock, and this random number modulates A1 and A2, or B1 and B2 when the random number is 1. When the random number is 0, no modulation occurs. For example, when mux 52 selects pattern A, B1 and B2 are modulated when the random number is 1, but not modulated when the random number is 0.

Figure 11:
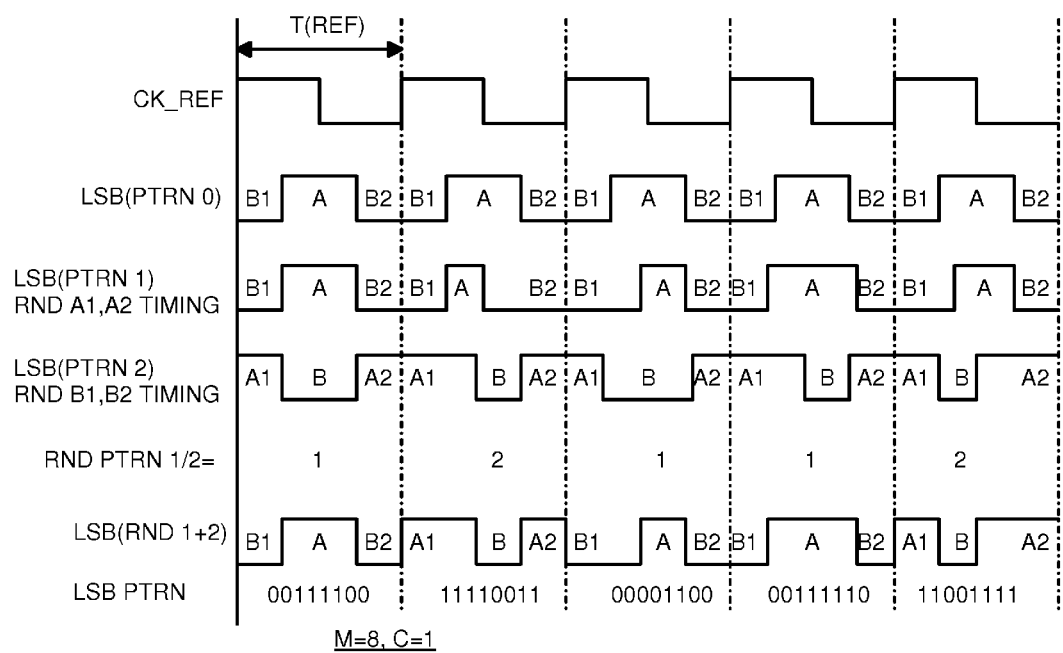
FIG. 11 is a waveform showing dithering of randomly-selected and adjusted LSB waveforms.

FIG. 11 is a waveform showing dithering of randomly-selected and adjusted LSB waveforms. Each CK_REF period has M/C LSB bits. In this example M=8 and C=1, so there are 8 bits per T(REF) period.

A simple pattern is LSB pattern 0. This is an A pattern and is identical for all T(REF) periods. Harmonics may occur, resulting in spur power and phase noise spikes.

LSB pattern 1 is an A pattern (high-going pulse). The value of A changes with each CK_REF due to changes in value DLF2 due to phase tracking. Also, the values of B1 and B2 are randomized over many T(REF) periods. For example, sometimes B1 is larger than B2, and sometimes B1 is larger than B2, as long as the sum B1+B2=M/C−A.

LSB pattern 2 is a B pattern (low-going pulse). The value of A changes with each CK_REF due to changes in value DLF2 due to phase tracking, and A=A1+A2. Also, the values of A1 and A2 are randomized over many T(REF) periods. The value of B is M/C−A, where M/C is the number of control clock periods per T(REF) period, and A, B, A1, A2, B1, B2 are expressed as whole numbers of control clock periods.

Random generator 42 selects either random pattern 1 or random pattern 2. The selected pattern is output as LSB(RND 1+2) in FIG. 11. In these waveforms, A1, A2 are shown as being randomized before selection, and B1, B2 are shown as being randomized before selection, while in FIG. 10 these values are randomized after selection by mux 52. Both embodiments are contemplated.

Each LSB waveform is divided into 8 regions controlled by 8 LSB bits. For example, in the first T(REF) period, the LSB bits are 00111100, as shown at the bottom of FIG. 11. The LSB pattern output to DCO 24 in the first T(REF) period is an A pattern with B1=2, A=4, and B 2=2.

In the second period, the random number changes to 2 (or 0) and the B pattern is selected rather than the A pattern. This has A1=4, B=2, and A2=2, producing LSB pattern bits 11110011.

In the third period, the random number changes to 1 and the A pattern (Pattern 1) is selected. This period has B1=4, A=2, and B 2=2, producing LSB pattern bits 00001100.

In the fourth period, the random number remains 1 and the A pattern (Pattern 1) is again selected. This period has B1=2, A=5, and B2=1, producing LSB pattern bits 00111110.

In the last period, the random number changes to 2 (or 0) and the B pattern is selected rather than the A pattern. This has A1=2, B=2, and A2=4, producing LSB pattern bits 11001111.

This random swapping of selected patterns and pulse locations within the period modulates the edges of the LSB applied to DCO 24. This random modulation of the LSB reduces spur noise from harmonics that may occur.

Figure 12:
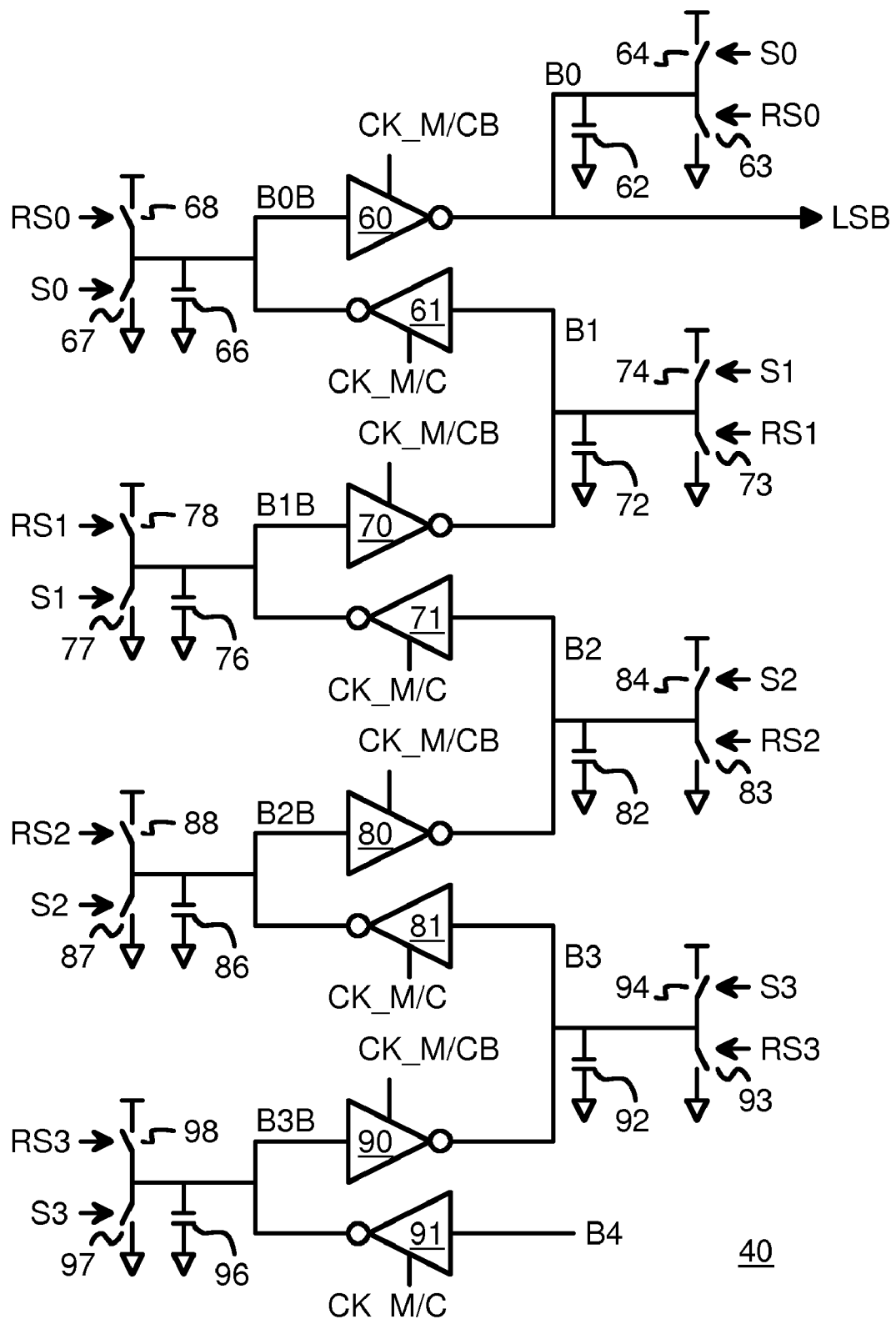
FIG. 12 is a schematic of a parallel-to-serial shift register.

FIG. 12 is a schematic of a parallel-to-serial shift register. Data in parallel-to-serial shift register 40 is stored on capacitors and shifted by inverters that are clocked. For example, bit 0 B0 is set by activating set signal S0, which closes switches 64, 67 to drive B0 and capacitor 62 high and B0B and capacitor 66 low. Bit 1 may be reset by activating reset signal RS1, which closes switches 73, 78 to drive B1 and capacitor 72 low and B1B and capacitor 76 high.

LSB data may be loaded into parallel-to-serial shift register 40 in parallel since each bit has its own set and reset signals. One all bits are loaded into parallel-to-serial shift register 40, the bits may be shifted down (up in the Figure) by alternately pulsing CK_M/C and its inverse, CK_M/CB, high and low. Inverters 60, 61, 70, 71, 80, 81, 90, 91 are high-impedance inverters that drive their outputs high or low (depending on the data input) when the clock is high, but disable the inverter into a high-impedance state when the clock is low.

FIG. 13 is a phase-noise plot comparing the PWM digital phase-lock system to a delta-sigma modulator (DSM) system. The PWM-controlled PLL of FIG. 3 (solid line) produces a lower close-in phase error than the standard digital phase system (dotted line), reducing the phase error by about 30 dB in this example.

Figure 1:
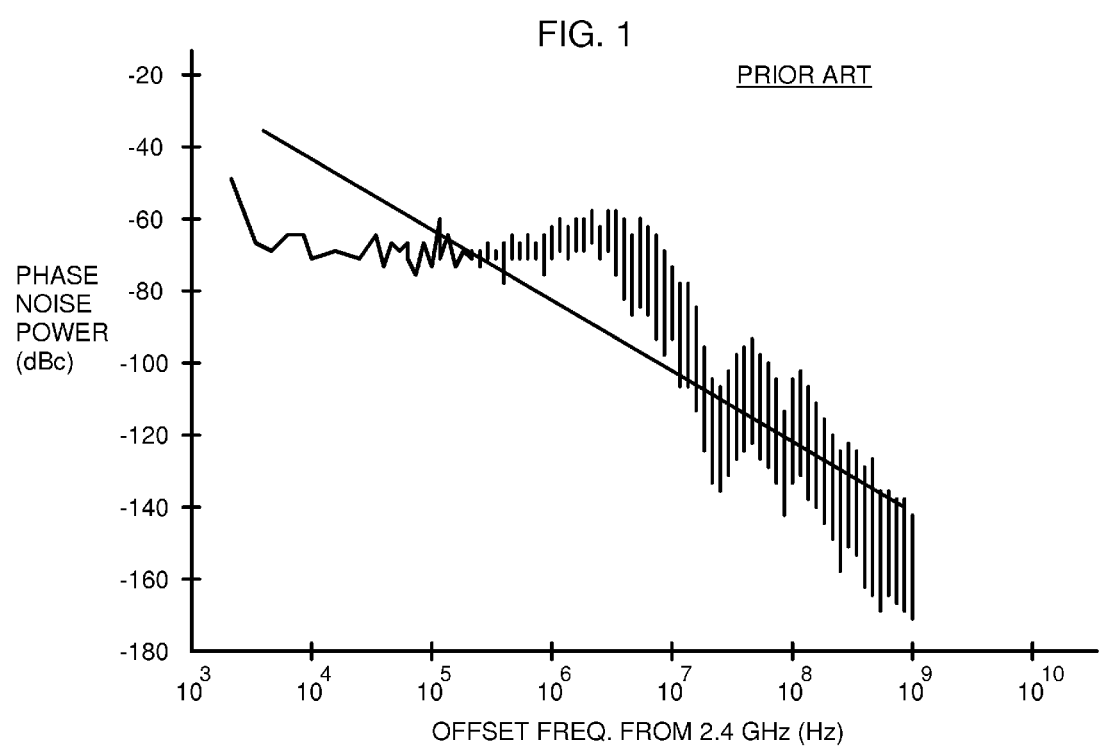
FIG. 1 is a graph of estimated phase noise in a prior-art digital phase-lock system.
Figure 2:
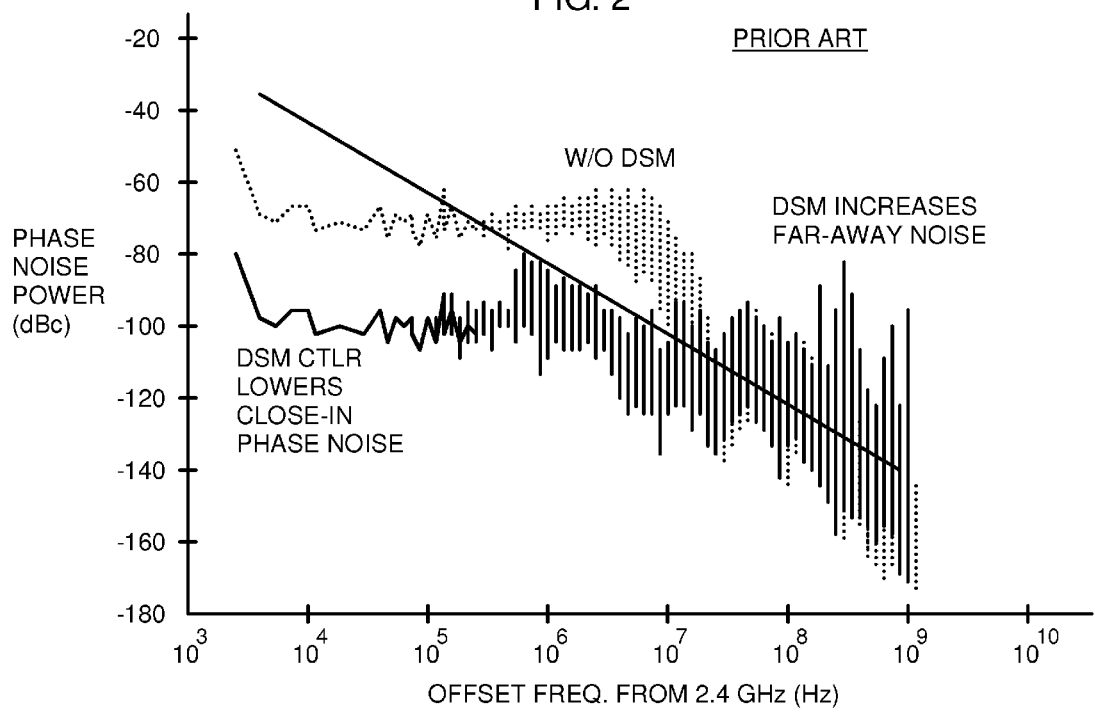
FIG. 2 is a graph of estimated phase noise in a prior-art digital phase-lock system using a delta-sigma modulator (DSM).

The PWM controlled PLL produces about the same far-away phase error as the prior-art non-DSM PLL, as can be seen at the higher frequencies in FIG. 13. Phase noise is not transferred from close-in to far-away as was the case of DSM (FIG. 2). Jitter is reasonable when higher frequencies are used.

FIG. 14 is a graph of the power spectrum of the clock output by the digitally-controlled oscillator. The PWM-controlled PLL of FIG. 3 has a center frequency of about 2.4 GHz where power consumption is the highest. While some power spikes occur at harmonics, these spikes are not severe since the LSB waveforms are dithered and randomized as shown in FIGS. 10-11. The spectrum power is normalized by a 1-ohm resistor in FIG. 14.

When the digital PLL is operated at a high frequency, power consumption is not extreme despite these high frequencies. Only parallel-to-serial shift register 40 operates at the higher frequency of control clock CK_M/C, while the pattern generators and random generators and pulse-width adjusters of PWM controller 20 operate at the lower reference frequency of CK_REF. The lower power consumption is ideal for integrated systems such as a System-On-a-Chip (SOC).

Phase tracking is improved, reducing the close-in phase noise without transferring phase noise from close-in to far-away frequency regions. Circuit complexity is reduced, especially since fewer portions of the circuit operate at the maximum frequency. Overall period jitter is also reduced due to dithering to reduce spur noise.

Alternate Embodiments

Several other embodiments are contemplated by the inventors. For example other values of M, C and other parameters are possible and may be substituted. The designer can tweak the circuit for the desired results for a particular application, such as by increasing C for lower power applications that can withstand more tracking error and phase noise, or reducing C for higher-power applications.

The actual results for power and noise may vary from the results shown in the graphs in the drawings, which are not intended to be exact. The amount of phase noise may vary for different regions, and jitter may affect the graphs or actual measurements send from a device. In particular, the graphed results can vary with the parameter C.

Parallel-to-serial shift register 40 may be implemented in a variety of technologies. Rather than dynamically storing data on capacitors, static random-access memory (SRAM) cells or flip-flops may be used. Other bistable elements may be used for data storage. While parallel loading of parallel-to-serial shift register 40 has been described using set and reset signals, data could be loaded in parallel such as to D-inputs of bistable latches. Global set or reset signals could also be added to initialize parallel-to-serial shift register 40. Switches 64, 68 . . . could be implemented as p-channel transistors that receive an inverse of the set signals, and switches 63, 67, 73 . . . could be implemented as n-channel transistors. Transmission gate could also be used.

While a single LSB has been described, PWM controller 20 could generate waveforms for 2 LSB's. While swapping A1 and A2 has been describe, other randomizing techniques could be used, such as adding or subtracting or shifting edges by one bit. Rather than use two random generators, a single random generator that generates two random bits could be used. Widths A1, A2, B1, B2 could be randomized before the A or B pattern is selected, rather than after pattern selection as shown in FIG. 10. PWM controller 20 could select from among more than two patterns during randomization. The pattern selection step and A1, A2, B1, B2 randomization could be performed as a single step by integrated logic such as a with a state machine control that accepts a random number as an input.

The random generators could generate pseudo-random numbers or some predefined sequence of numbers that randomize the waveforms sufficiently. Thus random numbers are understood to include pseudo-random sequences and do not have to be random in the purest mathematical sense.

The time resolution of TDC 10 can have coarse and fine resolutions as shown, or may have more possible resolutions. The phase comparator may be a D-type flip-flop and some combinatorial logic or some other circuit. Coarse digital loop filter 12 and fine digital loop filter 14 may include digital integrators, digital-signal processor (DSP) or other logic. Additional control signals such as global resets may be present in actual circuits.

While a center frequency of 2.4 GHz has been described, oscillators that are tuned for other frequencies may be substituted. Signals and values may be buffered, inverted, two's complemented, filtered, or otherwise altered at a variety of locations for a variety of purposes. Clocks may also be buffered, inverted, and qualified by other signals such as power down or reset signals.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A Digital Phase-Locked Loop (DPLL) comprising:
a reference clock input receiving a reference clock having a reference frequency;
a digitally-controlled oscillator (DCO) that generates an output clock having an output frequency that is determined by a digital oscillator input, the digital oscillator input having most-significant-bits (MSBs) and a least-significant-bit (LSB);
a feedback divider that divides the output clock by M to generate a feedback clock, wherein the output frequency is M times the reference frequency when the feedback clock is phase locked to the reference clock, wherein M is a whole number;
a control divider that divides the output clock by C to generate a control clock, wherein the output frequency is C times a control frequency of the control clock, and wherein the control frequency is C/M times the reference frequency when the feedback clock is phase locked to the reference clock, wherein C and M/C are each whole numbers;
a Time-to-Digital Converter (TDC) that receives the reference clock and the feedback clock, the TDC performing phase comparisons of the feedback clock to the reference clock using a coarse time resolution to generate a coarse phase compare signal and using a fine time resolution to generate a fine phase compare signal, wherein the fine time resolution represents a smaller amount of time than the coarse time resolution;
a coarse digital loop filter that receives the coarse time resolution from the TDC and generates the MSBs to the DCO;
a fine digital loop filter that receives the fine time resolution from the TDC and generates a fine loop filter value; and
a Pulse-Width-Modulation (PWM) controller that generates M/C LSB bits for each period of the reference clock, the M/C LSB bits forming a pulse that has a pulse-width determined by the fine loop filter value from the fine digital loop filter, the PWM controller delivering one of the M/C LSB bits to the digital oscillator input of the DCO in response to each period of the control clock;
wherein the PWM controller further comprises:
a parallel-to-serial shift register that is loaded in parallel with the M/C LSB bits for each period of the reference clock, the parallel-to-serial shift register serially delivering the M/C LSB bits to the LSB of the digital oscillator input of the DCO in response to the control clock, wherein a different one of the M/C LSB bits is delivered for each period of the control clock,
whereby the PWM controller generates LSB's to the digitally-controlled oscillator by modulating the pulse-width in response to the fine loop filter value.

2. The DPLL of claim 1 wherein C is 2 or more and M is 10 or more.

3. The DPLL of claim 1 wherein the PWM controller further comprises:
a first random generator that generates a first random number;
a selector that selects as a selected pattern a low-going pattern or a high-going pattern in response to the first random number;
wherein the low-going pattern represents a low-going pulse having the pulse-width;
wherein the high-going pattern represents a high-going pulse having the pulse-width;
wherein the PWM controller generates the M/C LSB bits to represent the selected pattern,
whereby low-going and high-going patterns are randomly selected.

4. The DPLL of claim 3 wherein the PWM controller further comprises:
a second random generator that generates a second random number;
a length adjuster that adjusts the pulse-width or a location of the low-going pulse or the high-going pulse within the M/C LSB bits in response to the second random number,
whereby low-going and high-going patterns are randomly adjusted.

5. The DPLL of claim 4 wherein the first random generator is clocked by the reference clock;
wherein the second random generator is clocked by the reference clock;
wherein loading of the parallel-to-serial shift register is synchronized to the reference clock;
wherein unloading of the parallel-to-serial shift register is synchronized to the control clock.

6. The DPLL of claim 1 wherein the PWM controller further comprises:
a first pattern generator that generates a first pattern having a low-going pulse represented by M/C LSB bits in response to the reference clock;
a second pattern generator that generates a second pattern having a high-going pulse represented by M/C LSB bits in response to the reference clock;
a first random generator that generates a first random number in response to the reference clock; and
a mux that receives the first pattern and the second pattern and the first random number, the mux outputting either the first pattern or the second pattern as a selected pattern in response to the first random number,
whereby patterns are randomized by the PWM controller.

7. The DPLL of claim 6 wherein the PWM controller further comprises:
   a second random generator that generates a second random number in response to the reference clock;
   an adjuster, receiving the selected pattern from the mux, for adjusting a location of the low-going pulse or a locations of the high-going pulse in the selected pattern in response to the second random number,
   whereby patterns are randomized by the PWM controller by adjusting the location of the low-going or high-going pulse.

8. The DPLL of claim 7 wherein the DCO produces the output clock with a reduced spur-power phase noise at higher frequencies when the PWM controller randomizes the patterns.

9. A digital phase-locked system comprising:
   a digital phase comparator that receives a reference clock and a feedback clock and generates a coarse phase comparison result and a fine phase comparison result;
   a coarse digital loop filter that digitally filters the coarse phase comparison result to generate most-significant-bits (MSBs);
   a fine digital loop filter that digitally filters the fine phase comparison result to generate a fine filter value;
   a Pulse-Width-Modulation (PWM) controller that generates a pattern of least-significant-bits (LSBs) that represent a pulse having a pulse-width determined by the fine filter value;
   a parallel-to-serial shift register that is loaded in parallel by the PWM controller with the pattern of LSB's;
   a digitally-controlled oscillator (DCO) that has a digital input that receives the MSBs and the LSBs and generates an output clock;
   a feedback divider that receives the output clock and generates the feedback clock; and
   a control divider that receives the output clock and generates a control clock;
   wherein the parallel-to-serial shift register shifts the pattern of LSBs to the digital input of the DCO, wherein the pattern of LSBs are serially delivered to the digital input in response to the control clock;
   whereby the pulse-width of the pattern of LSBs is modulated in response to the fine filter value.

10. The digital phase-locked system of claim 9 wherein the PWM controller further comprises:
    a low-going pattern generator that generates the pattern of LSBs by loading A1 high bits into a first A1 bits of the parallel-to-serial shift register, loading B low bits into a middle B bits of the parallel-to-serial shift register, and loading A2 high bits into a final A2 bits of the parallel-to-serial shift register;
    wherein A1+A2 represents the pulse-width determined by the fine filter value for pattern generated by the low-going pattern generator;
    a high-going pattern generator that generates the pattern of LSBs by loading B1 low bits into a first B1 bits of the parallel-to-serial shift register, loading A high bits into a middle A bits of the parallel-to-serial shift register, and loading B2 low bits into a final B2 bits of the parallel-to-serial shift register;
    wherein A represents the pulse-width determined by the fine filter value for the pattern generated by the high-going pattern generator;
    wherein A, B, A1, A2, B1, B2 are whole numbers.

11. The digital phase-locked system of claim 10 wherein the feedback divider divides the output clock by M to generate the feedback clock;
    wherein the control divider divides the output clock by C to generate the control clock;
    wherein M and C are whole numbers.

12. The digital phase-locked system of claim 11 wherein the PWM controller loads M/C bits into the parallel-to-serial shift register for each period of the reference clock.

13. The digital phase-locked system of claim 12 wherein A1+B+A2 is equal to M/C;
    wherein B1+A+B2 is equal to M/C.

14. The digital phase-locked system of claim 10 wherein the PWM controller further comprises:
    a random generator that randomly selects the pattern from either the high-going pattern generator or from the low-going pattern generator for loading into the parallel-to-serial shift register,
    whereby low-going and high-going patterns are randomly selected to dither the LSBs to the digital input to the DCO.

15. The digital phase-locked system of claim 14 wherein the PWM controller further comprises:
    a randomizer that randomly swaps A1 and A2 for the low-going pattern generator, and randomly swaps B1 and B2 for the high-going pattern generator, before loading into the parallel-to-serial shift register,
    whereby patterns are randomly swapped to dither the LSBs to the digital input to the DCO.

16. A low-phase-noise Digital Phase-Locked Loop comprising:
    a reference clock input receiving a reference clock having a reference frequency;
    digitally-controlled oscillator (DCO) means for generating an output clock having an output frequency that is determined by a digital oscillator input, the digital oscillator input having most-significant-bits (MSBs) and a least-significant-bit (LSB);
    feedback divider means for dividing the output clock by M to generate a feedback clock, wherein the output frequency is M times the reference frequency when the feedback clock is phase locked to the reference clock, wherein M is a whole number;
    control divider means for dividing the output clock by C to generate a control clock, wherein the output frequency is C times a control frequency of the control clock, and wherein the control frequency is C/M times the reference frequency when the feedback clock is phase locked to the reference clock, wherein C and M/C are each whole numbers;
    Time-to-Digital Converter (TDC) means, receiving the reference clock and the feedback clock, for coarsely comparing phases of the feedback clock to the reference clock using a coarse time resolution to generate a coarse phase compare signal, and for finely comparing phases of the feedback clock to the reference clock using a fine time resolution to generate a fine phase compare signal, wherein the fine time resolution represents a smaller amount of time than the coarse time resolution;
    coarse digital loop filter means for digitally filtering the coarse time resolution from the TDC means to generate the MSBs to the DCO means;
    fine digital loop filter means for digitally filtering the fine time resolution from the TDC means to generate a fine loop filter value; and
    Pulse-Width-Modulation (PWM) controller means for generating M/C LSB bits for each period of the reference clock, the M/C LSB bits forming a pulse that has a pulse-width determined by the fine loop filter value from the fine digital loop filter means, the PWM controller means also for delivering one of the M/C LSB bits to the digital oscillator input of the DCO means in response to each period of the control clock, wherein the PWM controller means further comprises:

parallel-to-serial shift register means, loaded in parallel with the M/C LSB bits for each period of the reference clock, for serially delivering the M/C LSB bits to the LSB of the digital oscillator input of the DCO means in response to the control clock, wherein a different one of the M/C LSB bits is delivered for each period of the control clock, whereby the PWM controller means generates LSB's to the DCO means by modulating the pulse-width in response to the fine loop filter value.

17. The low-phase-noise Digital Phase-Locked Loop of claim 16 wherein the PWM controller means further comprises:

first random generator means for generating a first random number;

selector means for selecting as a selected pattern a low-going pattern or a high-going pattern in response to the first random number;

wherein the low-going pattern represents a low-going pulse having the pulse-width;

wherein the high-going pattern represents a high-going pulse having the pulse-width;

wherein the PWM controller means generates the M/C LSB bits to represent the selected pattern, whereby low-going and high-going patterns are randomly selected.

18. The low-phase-noise Digital Phase-Locked Loop of claim 17 wherein the PWM controller means further means comprises:

second random generator means for generating a second random number;

length adjuster means for adjusting a location of the low-going pulse or a location of the high-going pulse within the M/C LSB bits in response to the second random number, whereby low-going and high-going patterns are randomly adjusted.

* * * * *